United States Patent
Yaguchi

(10) Patent No.: US 11,923,771 B2
(45) Date of Patent: Mar. 5, 2024

(54) CONTROL CIRCUIT AND POWER SOURCE CIRCUIT

(71) Applicant: FUJI ELECTRIC CO., LTD., Kanagawa (JP)

(72) Inventor: Yukihiro Yaguchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 525 days.

(21) Appl. No.: 17/159,053

(22) Filed: Jan. 26, 2021

(65) Prior Publication Data
US 2021/0270878 A1    Sep. 2, 2021

(30) Foreign Application Priority Data

Feb. 27, 2020    (JP) ................... 2020-032039

(51) Int. Cl.
*H02M 3/156* (2006.01)
*H02M 1/32* (2007.01)

(52) U.S. Cl.
CPC ............. *H02M 3/156* (2013.01); *H02M 1/32* (2013.01)

(58) Field of Classification Search
CPC ............... H02M 1/4225; H02M 1/32; H02M 3/155–1588
See application file for complete search history.

(56) References Cited

U.S. PATENT DOCUMENTS

| | | | |
|---|---|---|---|
| 9,641,070 B2 * | 5/2017 | Wibben | H02M 3/156 |
| 2009/0190382 A1 | 7/2009 | Usui | |
| 2011/0032024 A1 * | 2/2011 | Chen | H03K 17/687 |
| | | | 327/524 |
| 2013/0293270 A1 * | 11/2013 | Lee | H02M 3/156 |
| | | | 327/113 |
| 2016/0181942 A1 * | 6/2016 | Sugawara | H02M 3/156 |
| | | | 363/126 |
| 2019/0260290 A1 * | 8/2019 | Maejima | H02M 1/32 |

FOREIGN PATENT DOCUMENTS

| | | |
|---|---|---|
| JP | 2009177954 A | 8/2009 |
| JP | 2018026950 A | 2/2018 |
| JP | 2019058070 A | 4/2019 |

OTHER PUBLICATIONS

Office Action issued for counterpart Japanese Application No. 2020-032039, issued by the Japanese Patent Office dated Aug. 8, 2023 (drafted on Aug. 2, 2023).

* cited by examiner

*Primary Examiner* — Fred E Finch, III

(57) ABSTRACT

A control circuit for controlling an output transistor for outputting power includes: a ramp terminal connected to a ramp resistance; a ramp waveform generation unit for generating a ramp waveform including a slope corresponding to a resistance value of the ramp resistance; an output control unit for controlling at least one of an ON time or an OFF time of the output transistor based on a comparison result between the ramp waveform and a comparison voltage; and a state detection unit for detecting a state of the ramp resistance connected to the ramp terminal, wherein the output control unit turns the output transistor to an OFF state regardless of the comparison result, when the state of the ramp resistance becomes a predetermined state.

9 Claims, 6 Drawing Sheets

CONTROL CIRCUIT AND POWER SOURCE CIRCUIT

The contents of the following Japanese patent application (s) are incorporated herein by reference:
NO. 2020-032039 filed on Feb. 27, 2020.

BACKGROUND

1. Technical Field

The present invention relates to a control circuit and a power source circuit.

2. Related Art

Patent Document 1 has disclosed a configuration for "outputting the triangular wave signal A to the non-inverted input terminal of a PWM comparator" (paragraph 0010).
Patent Document 2 has disclosed a configuration for "adjusting the duty ratio of the switching transistor Ml based on the FB terminal voltage" (paragraph 0009).

PRIOR ART DOCUMENT

Patent Document

Patent Document 1: Japanese Patent Application Publication No. 2009-177954
Patent Document 2: Japanese Patent Application Publication No. 2019-58070

When the slope of a ramp waveform, such as a triangular wave, fluctuates, the circuit that operates based on the ramp waveform may not be able to operate normally.

SUMMARY

A first aspect of the present invention provides a control circuit for controlling an output transistor for outputting power. The control circuit may include a ramp terminal connected to a ramp resistance. The control circuit may include a ramp waveform generation unit for generating a ramp waveform including a slope corresponding to a resistance value of the ramp resistance. The control circuit may include an output control unit for controlling at least one of an ON time or an OFF time of the output transistor, based on the comparison result between the ramp waveform and a comparison voltage. The control circuit may include a state detection unit for detecting a state of the ramp resistance connected to the ramp terminal. The output control unit may turn the output transistor to an OFF state based on an output of the state detection unit regardless of the comparison result, when the state of the ramp resistance becomes a predetermined state.

The output control unit may turn the output transistor to the OFF state when the resistance value of the ramp resistance becomes out of an allowable range.

The state detection unit may detect the ramp current flowing through the ramp terminal.

A clamp power source may be included for clamping the voltage applied to the ramp terminal.

The state detection unit may include a mirror current generation unit for generating the mirror current of the ramp current. The state detection unit may include a comparison unit for comparising at least one of the upper allowable limit value and lower allowable limit value of the mirror current, with the mirror current.

The comparison unit may include a current subtracting unit for generating the differential current by subtracting the reference current corresponding to the upper allowable limit value or lower allowable limit value from the mirror current. The comparison unit may include a voltage comparison unit for comparising the differential voltage corresponding to the differential current with the reference voltage.

In the current subtracting unit, the current value of the reference current may be variable.

In the mirror current generation unit, with respect to the current value of the ramp current, the current value ratio of the mirror current may be variable.

The mirror current generation unit may change the ratio of the current value of the mirror current to the current value of the ramp, corresponding to the change of the current value of the reference current in the current subtracting unit.

The state detection unit may detect the voltage applied to the ramp terminal.

A second aspect of the present invention provides an output transistor for outputting power, and a power source circuit including a control circuit according to the first aspect, for controlling the output transistor.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments shall not be construed as limiting the claimed invention. Also, not all combinations of features described in the embodiments are essential for means to solve problems provided by aspects of the invention.

Figure 1:
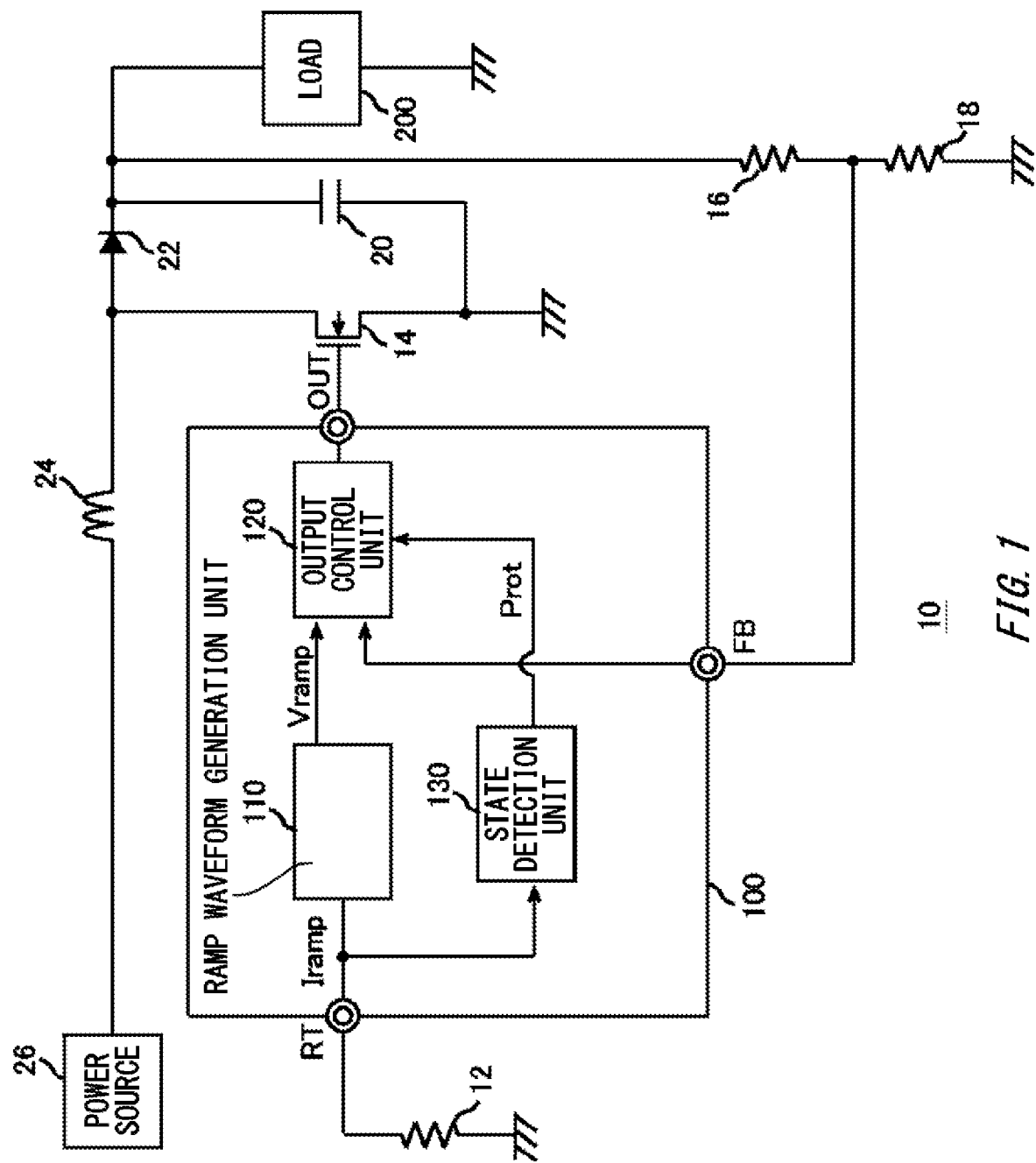
FIG. 1 illustrates one example of a power source circuit 10 for supplying power to a load 200.

FIG. 1 illustrates one example of a power source circuit 10 for supplying power to a load 200. The power source circuit 10 includes an output transistor 14 for outputting power, and a control circuit 100 for controlling the output transistor 14. The control circuit 100 controls the power value output by the power source circuit 10 to the load 200, by adjusting the duty ratio of ON and OFF states of the output transistor 14.

The control circuit 100 generates a ramp waveform including a slope corresponding to the resistance value of a ramp resistance 12 connected to a ramp terminal RT. The control circuit 100 may control the duty ratio of the output transistor 14, based on the comparison result between the ramp waveform and the voltage applied to the load 200.

Such operations enable the adjustment of the voltage applied to the load 200 to a predetermined value.

The power source circuit 10 of this example includes a power source 26, an inductor 24, a diode 22, a capacitor 20, a voltage dividing resistance 16, a voltage dividing resistance 18, and the ramp resistance 12. However, the configuration of the power source circuit 10 is not limited to this.

The power source 26 generates voltage and current of DC or AC. The inductor 24 is provided between the power source 26 and the load 200. In this specification, the arrangement on an electric path (for example, wiring) between two configurations may be simply referred to as being arranged between two configurations. The diode 22 is provided between the inductor 24 and the load 200. The diode 22 is arranged so that the direction from the inductor 24 to the load 200 is turned to the forward direction. The capacitor 20 is provided between a cathode of the diode 22 and a predetermined reference potential. The reference potential of this example is the ground potential.

The output transistor 14 is provided between the anode of the diode 22 and the reference potential. When the output transistor 14 is turned to the ON state, a large current flows from the inductor 24 to the ground potential. When the output transistor 14 is turned to the OFF state, the current corresponding to the current flowing to the ground potential is supplied to the capacitor 20 and the load 200 via the diode 22. By repeating the turning ON and OFF of the output transistor 14, the output voltage of the power source 26 can be boosted to charge the capacitor 20.

The voltage dividing resistance 16 and the voltage dividing resistance 18 are arranged in series between the cathode of the diode 22 and the reference potential. The voltage at the connection point between the voltage dividing resistance 16 and the voltage dividing resistance 18 becomes the voltage obtained by dividing the output voltage to the load 200 (divided voltage). The control circuit 100 may has a feedback terminal FB to which the divided voltage is applied. The control circuit 100 controls the output transistor 14 so that the voltage applied to the feedback terminal FB becomes a predetermined voltage.

The control circuit 100 includes a ramp waveform generation unit 110, an output control unit 120 and a state detection unit 130. Also, the control circuit 100 includes the ramp terminal RT connected with the ramp resistance 12, and an output terminal OUT connected with the gate terminal of the output transistor.

The control circuit 100 may be a semiconductor chip. The ramp resistance 12 may also be external to or built-in the control circuit 100. Also, one or more configurations among the power source 26, the inductor 24, the diode 22, the output transistor 14 and the capacitor 20 may also be built-in the control circuit 100.

The ramp waveform generation unit 110 generates the ramp waveform including a slope corresponding to the resistance value of the ramp resistance 12. The ramp waveform may be a voltage waveform, or may be a current waveform. The ramp waveform generation unit 110 of this example generates a ramp waveform Vramp, which is a voltage waveform. The ramp waveform is, for example, a triangular wave, a sawtooth wave and so on. The ramp waveform may also have a rising edge or a falling edge of the slope corresponding to the resistance value of the ramp resistance 12.

The output control unit 120 controls at least one of the ON time or OFF time of the output transistor 14, based on the comparison result between the ramp waveform and a predetermined comparison voltage. The comparison voltage may be generated corresponding to the feedback voltage applied to the feedback terminal FB. For example, the comparison voltage may also be an error voltage corresponding to the difference between the feedback voltage and a predetermined target voltage. By controlling the output transistor 14 corresponding to the error voltage, the voltage of the capacitor 20 can be controlled to the voltage corresponding to the target voltage.

The state detection unit 130 detects a state of the ramp resistance 12 connected with the ramp terminal RT. The state of the ramp resistance 12 is, for example, the resistance value of the ramp resistance 12. The resistance value may be detected based on the current flowing through the ramp resistance 12. The state detection unit 130 may also detect at least one of a short circuit state in which the ramp terminal RT is shorted to the predetermined reference potential, and an open circuit state in which the ramp terminal RT is not connected to the ramp resistance 12, as the state of the ramp resistance 12. In the case of the short circuit state, the resistance value of the ramp resistance 12 is approximately 0, and in the case of the open circuit state, the resistance value of the ramp resistance 12 becomes very large.

The output control unit 120 controls to turn the output transistor 14 to the OFF state regardless of the comparison result between the ramp waveform Vramp with the comparison voltage, when the state of the ramp resistance 12 become a predetermined state. The output control unit 120 determines the state of the ramp resistance 12 based on the output of the state detection unit 130. The state detection unit 130 may output a protection signal Prot indicating that the state of the ramp resistance 12 has become the predetermined state, to the output control unit 120.

For example, the output control unit 120 compulsorily turns the output transistor 14 to OFF state when the ramp resistance 12 becomes the short circuit state or the open circuit state. When the ramp resistance 12 becomes the short circuit state or the open circuit state, the slope of the ramp waveform Vramp becomes very large or very small. Thus, the output transistor 14 may not be able to be appropriately controlled, leading to excessive voltage or current flowing through it. In this example, as the output transistor 14 is controlled to be the OFF state corresponding to the state of the ramp resistance 12, an occurrence of the excessive voltage or current can be suppressed. The output control unit 120 may turn the output transistor 14 to OFF state, when the current value of a ramp current flowing through the ramp resistance 12 becomes out of a predetermined allowable range.

The state detection unit 130 may detect the ramp current Tramp flowing through the ramp terminal RT as the state of the ramp resistance 12. The state detection unit 130 may also detect the voltage applied to the ramp terminal RT as the state of the ramp resistance 12. The state detection unit 130 may also acquire a state regarding the resistance value of the ramp resistance 12 as the state of the ramp resistance 12. The state detection unit 130 may also calculate the resistance value of the ramp resistance 12 from the voltage and current applied to the ramp terminal RT. The output control unit 120 may turn the output transistor 14 to OFF state when the ramp current or voltage applied to the ramp resistance 12, or the resistance value of the ramp resistance 12 become out of the predetermined allowable range.

Figure 2:
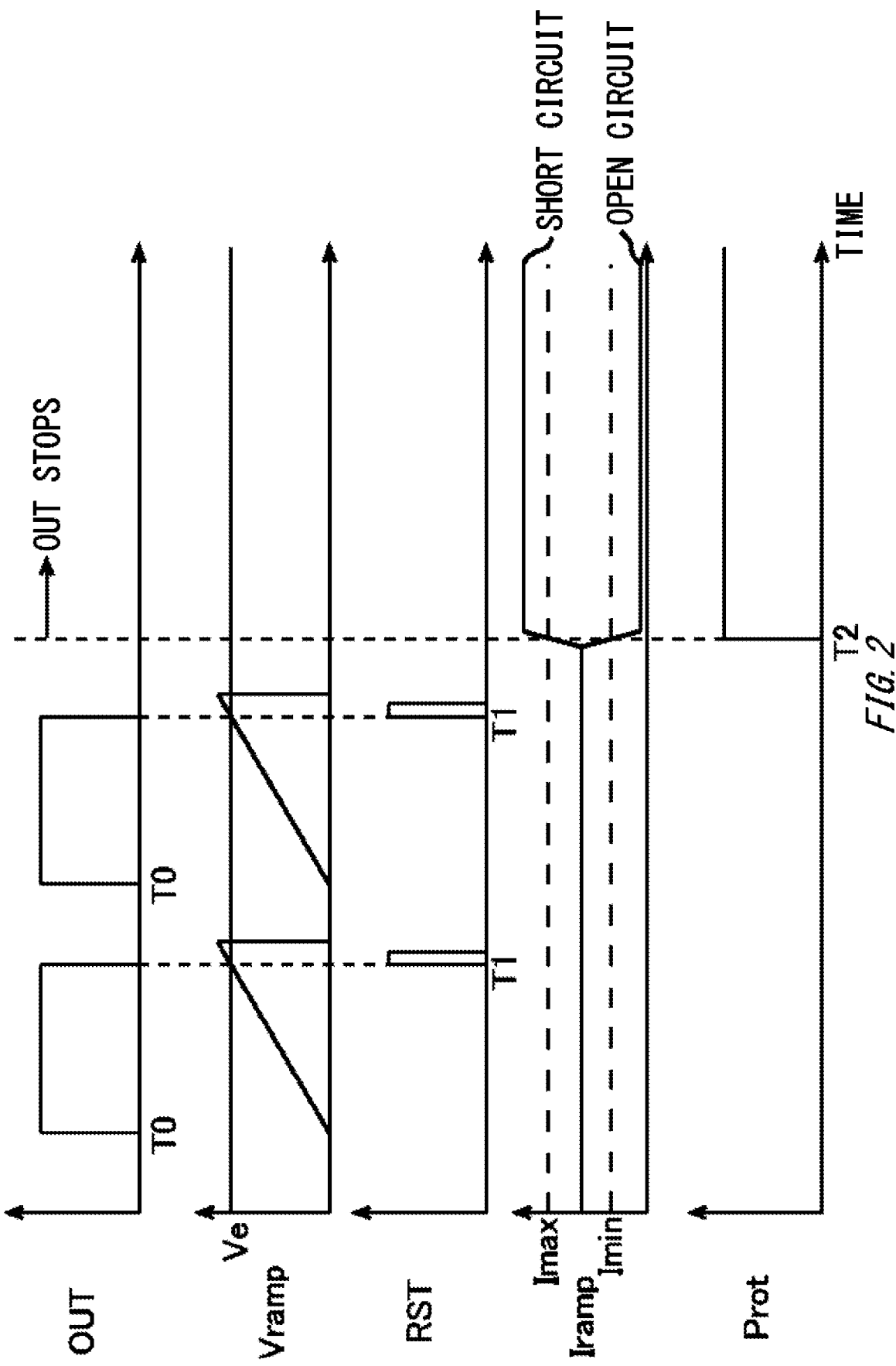
FIG. 2 illustrates a timing chart showing exemplary operations of a control circuit 100.

FIG. 2 illustrates a timing chart showing an exemplary operation of the control circuit 100. In FIG. 2, the vertical axis is the magnitude of each signal, and the horizontal axis is the time. The output control unit 120 of this example controls the output transistor 14 to be in the ON state at periodic timing (T0). In this example, by outputting a signal of Logic H from the output terminal OUT, the output transistor 14 is controlled to be in the ON state.

The output control unit 120 generates a reset signal RST, when the voltage value of the ramp waveform Vramp becomes larger than the error voltage Ve corresponding to the difference between the feedback voltage and the target voltage. In the example of FIG. 2, at time T1, the voltage value of the ramp waveform Vramp becomes larger than the error voltage Ve. The output control unit 120 controls the output transistor 14 to be at OFF state corresponding to the reset signal RST. In this example, by outputting a signal of logic L from the output terminal OUT, the output transistor 14 is controlled to be at OFF state. Such operations enable the control of the duty ratio of the output transistor 14 corresponding to the feedback voltage FB.

The state detection unit 130 of this example detects the current value of the ramp current Iramp flowing through the ramp resistance 12 as the state of the ramp resistance 12. The state detection unit 130 determines the case where the ramp current Iramp is within the allowable range defined by the predetermined maximum value Imax and the minimum value Imin as a normal state, and determines the case where the ramp current Iramp becomes out of the allowable range as an abnormal state. For example, as illustrated in FIG. 2, when ramp resistance 12 becomes the short circuit state, the ramp current Iramp becomes larger than the maximum value Imax, and when the ramp resistance 12 becomes open circuit state, the ramp current Iramp becomes smaller than the minimum value Imin. In the example of FIG. 2, at time T2, the ramp current Iramp becomes out of the allowable range.

The output control unit 120 controls the output transistor 14 to be at OFF state when the ramp current Iramp is out of the allowable range. In this example, the logical value of the signal output from the output terminal OUT is fixed to be the logic L. Thereby, the occurrence of overvoltage and overcurrent and so on can be suppressed.

Figure 3:
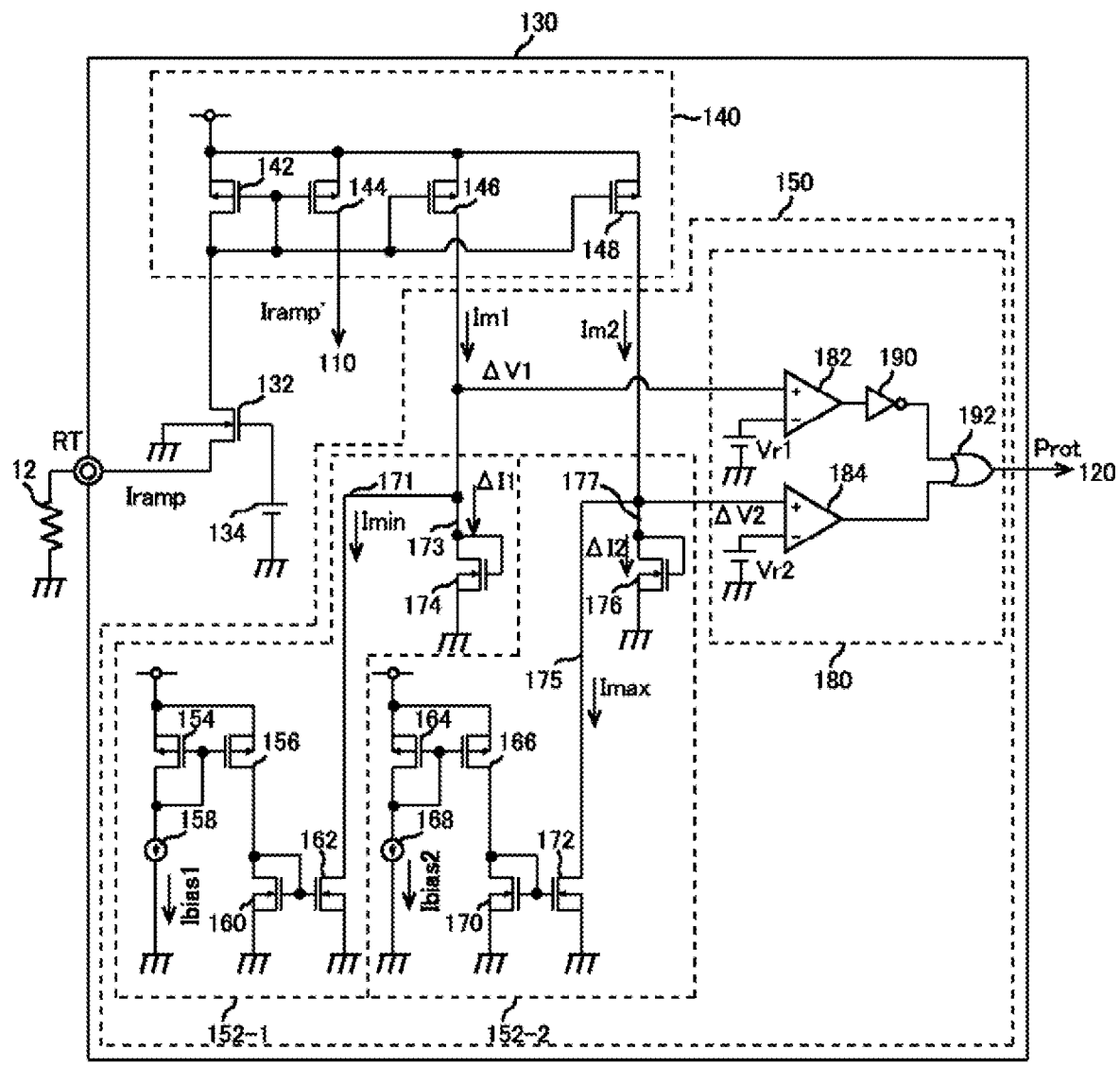
FIG. 3 illustrates an exemplary configuration of a state detection unit 130.

FIG. 3 illustrates an exemplary configuration of the state detection unit 130. The state detection unit 130 of this example has a ramp current generation unit 132, a clamp power source 134, a mirror current generation unit 140 and a comparison unit 150.

The ramp current generation unit 132 of this example is an NMOS transistor provided between a predetermined high potential and the ramp terminal RT. A constant clamp voltage generated by the clamp power source 134 is applied to the gate terminal of the ramp current generation unit 132. Thereby, the ramp current Iramp corresponding to the resistance value of the ramp resistance 12 flows through the ramp current generation unit 132.

The mirror current generation unit 140 generates a mirror current of the ramp current Iramp. The mirror current generation unit 140 may generate a plurality of mirror currents. The mirror current generation unit 140 has a plurality of transistors 142, 144, 146 and 148 provided in parallel. The transistor 142 is arranged between the ramp current generation unit 132 and the predetermined high potential. The transistor 142 of this example is a diode-connected PMOS transistor. The ramp current Iramp flows through the transistor 142.

The transistors 144, 146 and 148 of this example are arranged in parallel with the transistor 142, and each gate terminal is a PMOS transistor connected with the gate terminal of the transistor 142. Thereby, the mirror current having a predetermined mirror ratio to the ramp current Iramp flows through each of the transistors 144, 146, 148. The mirror ratio of each mirror current may be the same, or may be different. The mirror ratio of each transistor can be adjusted according to the channel area, the amount of saturation currents and so on of each transistor.

The mirror current generation unit 140 may supply one mirror current as a ramp current Iramp' to the output control unit 120. The mirror ratio of the ramp current Iramp' may be 1, or may be other than 1. In this example, the transistor 144 generates the ramp current Iramp'.

The mirror current generation unit 140 of this example generates the mirror current Im1 and the mirror current Im2. The mirror current Im1 and mirror current Im2 are preferred to have the same mirror ratio with each other. The mirror ratio of the mirror current Im1 and the mirror current Im2 may be the same as the mirror ratio of the ramp current Iramp'.

The comparison unit 150 compares the current value of the mirror currents (Im1, Im2) with at least one of upper and lower allowable limit values of the mirror current. The comparison unit 150 of this example compares the mirror current Im1 with the lower allowable limit value, and compares the mirror current Im2 with the upper allowable limit value.

The comparison unit 150 has a current subtracting unit for subtracting the reference current corresponding to the upper or lower allowable limit values from the mirror current. The comparison unit 150 of this example has a current subtracting unit 152-1 and a current subtracting unit 152-2. The current subtracting unit 152-1 generates a differential current ΔI1 obtained by subtracting the reference current Imin corresponding to the lower allowable limit value from the mirror current Im1. The current subtracting unit 152-2 generates a differential current ΔI2 obtained by subtracting the reference current Imax corresponding to the upper allowable limit value from the mirror current Im2. Each current subtracting unit 152 may generate a differential current obtained by subtracting the reference current from the mirror current, by drawing the reference current from the flowing path of the mirror current.

The current subtracting unit 152-1 has a wiring 171 and a wiring 173 connecting the transistor 146 and the reference potential. The wiring 171 and the wiring 173 are two branch wirings of the wiring where the mirror current Im1 flows. The wiring 171 is a path for drawing the reference current Imin. The wiring 171 is connected with the circuit for drawing the reference current Imin. The circuit has a current source 158, a transistor 154, a transistor 156, a transistor 160 and a transistor 162.

The current source 158 generates a preset DC current Ibias 1. The DC current Ibias 1 is set corresponding to the reference current Imin. The transistor 154 is a diode-connected PMOS transistor arranged between the current source 158 and the high potential. The DC current Ibias 1 flows through the transistor 154.

The transistor 156 is a PMOS transistor mirror connected with the transistor 154, where the mirror current of the DC current Ibias 1 flows. The gate terminal of the transistor 156 is connected to the gate terminal of the transistor 154.

The transistor 160 is a diode-connected NMOS transistor arranged between the transistor 156 and the reference potential. The same mirror current as the transistor 156 flows through the transistor 160. The transistor 162 is an NMOS transistor connected with the wiring 171, and mirror connected with the transistor 160. The transistor 162 mirrors the current flowing through the transistor 160, and generates the reference current Imin. Thereby, the reference current Imin can be drawn to the wiring 171.

The transistor 174 is a diode-connected NMOS transistor connected with the wiring 173. The differential current ΔI1 obtained by subtracting the reference current Imin from the mirror current Im1 flows through the transistor 174. Thereby, the node voltage between the branch point of the wiring 171 and the wiring 173, and the transistor 146 becomes the differential voltage ΔV1 corresponding to the differential current ΔI1.

The current subtracting unit 152-2 has the same configuration as the current subtracting unit 152-1. The current subtracting unit 152-2 of this example has a wiring 175, a wiring 177, a transistor 176, a current source 168, a transistor 164, a transistor 166, a transistor 170 and a transistor 172. The configuration of these components has the same function and configuration as the wiring 171, the wiring 173, the transistor 174, the current source 158, the transistor 154, the transistor 156, the transistor 160 and the transistor 162 of the current subtracting unit 152-1. However, the wiring 175 and the wiring 177 are two branch wirings of the wiring where the mirror current Im2 flows. Also, a DC current Ibias 2 is set at the current source 168 corresponding to the reference current Imax. Thereby, the reference current Imax can be drawn to the wiring 175. The differential current ΔI2 obtained by subtracting the reference current Imax from the mirror current Im2 flows through the wiring 177. The node voltage between the branch point of the wiring 175 and the wiring 175, and the transistor 148 becomes the differential voltage ΔV2 corresponding to the differential current ΔI2.

The voltage comparison unit 180 compares the differential voltage ΔV with a predetermined reference voltage. The voltage comparison unit 180 of this example has a voltage comparison circuit 182 and a voltage comparison circuit 184. The voltage comparison circuit 182 compares the differential voltage ΔV1 with the predetermined reference voltage Vr1. The voltage comparison circuit 184 compares the differential voltage ΔV2 with the predetermined reference voltage Vr2.

The voltage comparison circuit 182 may be a logic circuit, which outputs the logical value 1 when the differential voltage ΔV1 is larger than the reference voltage Vr1, and outputs the logical value 0 when the differential voltage ΔV1 is below the reference voltage Vr1. The reference voltage Vr1 may be the same voltage as the differential voltage ΔV1, when the differential current ΔI1 is 0A. In this case, the voltage comparison circuit 182 outputs the logical value 0 when the mirror current Im1 is below the reference current Imin. The reference voltage Vr1 may also be the voltage with a predetermined offset value.

The voltage comparison circuit 184 may be a logic circuit, which outputs the logical value 1 when the differential voltage ΔV 2 is larger than the reference voltage Vr 2, and outputs the logical value 0 when the differential voltage ΔV 2 is below the reference voltage Vr 2. The reference voltage Vr 2 may be the same voltage as the differential voltage ΔV 2 when the differential current ΔI 2 is 0 A. In this case, the voltage comparison circuit 184 outputs the logical value 1 when the mirror current Im2 is larger than the reference current Imax. The reference voltage Vr 2 may also be a voltage with a predetermined offset value.

The voltage comparison unit 180 outputs the protection signal Prot and controls the output transistor 14 to be at OFF state, when at least one of the condition of the voltage comparison circuit 182 outputting the logical value 0 and the condition of the voltage comparison circuit 184 outputting the logical value 1, is satisfied. The voltage comparison unit 180 of this example may have an inverter 190 and an OR circuit 192. The inverter 190 inverts the output logical value of the voltage comparison circuit 182. The OR circuit 192 outputs the logical OR of the output of the inverter 190 and the output of the voltage comparison circuit 184. That is, the OR circuit 192 outputs the logical value 1 as the protection signal Prot, when at least one of the condition of the voltage comparison circuit 182 outputting the logical value 0 and the condition of the voltage comparison circuit 184 outputting the logical value 1, is satisfied.

With the state detection unit 130 of this example, whether the ramp current Iramp is within the allowable range defined by the reference current Imax and Imin can be judged. Also, as the mirror current of the ramp current Iramp is generated, the influence on the ramp current Iramp can be suppressed and, at the same time, the state of the ramp current Iramp can be detected. Also, as the voltages are compared in the voltage comparison unit 180 after subtracting current in the current subtracting unit 152, the voltage input to the voltage comparison unit 180 can be smaller.

Also, by adjusting the DC current set at the current source 158, 168, the reference current Imin, Imax can be variably adjusted. Thus, the allowable range of the ramp current Iramp can be easily adjusted. That is, the allowable range of the resistance value of the ramp resistance 12 can be easily adjusted.

Also, the mirror ratio of the mirror current generation unit 140 may be variable. By adjusting the mirror ratio, the magnitude of each current of the ramp current Iramp', the mirror current Im1, Im2 can be adjusted. By adjusting the current value of the ramp current Iramp', the slope of the ramp waveform can be adjusted.

Figure 4:
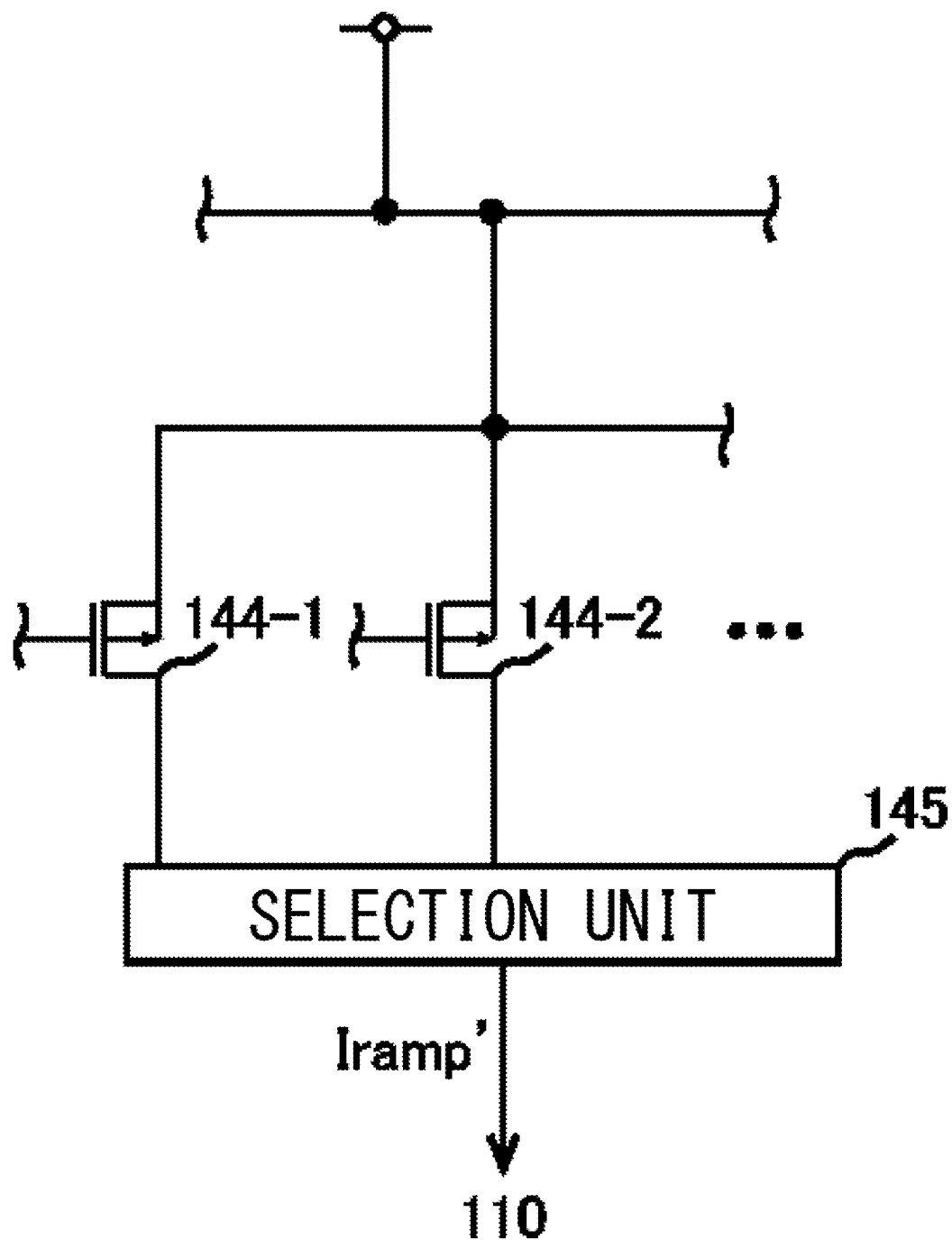
FIG. 4 illustrates one example of a configuration for adjusting the mirror ratio in a mirror current generation unit 140.

FIG. 4 illustrates one example of a configuration for adjusting the mirror ratio in the mirror current generation unit 140. In this example, the transistor 144 will be described, but the transistor 146 and the transistor 148 may have similar configurations.

The mirror current generation unit 140 of this example has a plurality of transistors 144 and a selection unit 145. The plurality of transistors 144 are provided in parallel with each other, each of which is mirror connected with the transistor 142. In this example, each transistor 144 has a different mirror ratio. That is, the current value of the ramp current Iramp' flowing through each transistor 144 is different.

The selection unit 145 selects and connects any of the transistors 144 to a circuit in the subsequent stage (the ramp waveform generation unit 110 in this example). Thereby, the slope of the ramp waveform can be adjusted by adjusting the mirror ratio of the ramp current Iramp'. For example, the slope of the ramp waveform can be adjusted corresponding to the speed of the operations of the output transistor 14.

The mirror ratios of the transistor 146 and the transistor 148 may be selected as the same value as the mirror ratio of the transistor 144. Thereby, the mirror current Im1, Im2 simulating the ramp current Iramp' can be generated.

Note that, when the mirror ratios of the transistor 146 and the transistor 148 are changed by the current subtracting unit 152, the current subtracting unit 152 may change the magnitude of the reference current Imin and the reference current Imax corresponding to the change. As described above, by adjusting the DC current Ibias 1 of the current source 158 and the DC current Ibias 2 of the current source 168, the reference current Imin and the reference current Imax can be adjusted.

For example, the current subtracting unit 152-1 enlarges the DC current Ibias 1 when the mirror ratio of the transistor 146 is enlarged, and reduces the DC current Ibias 1 when the mirror ratio of the transistor 146 is reduced. Similarly, the current subtracting unit 152-2 may enlarge the DC current Ibias 2 when the mirror ratio of the transistor 148 is enlarged, and may reduce the DC current Ibias2 when the mirror ratio of the transistor 148 is reduced. With such a control, according to the change in the current value of the mirror current Im, the reference current Imin and the reference current Imax can be appropriately changed.

Figure 5:
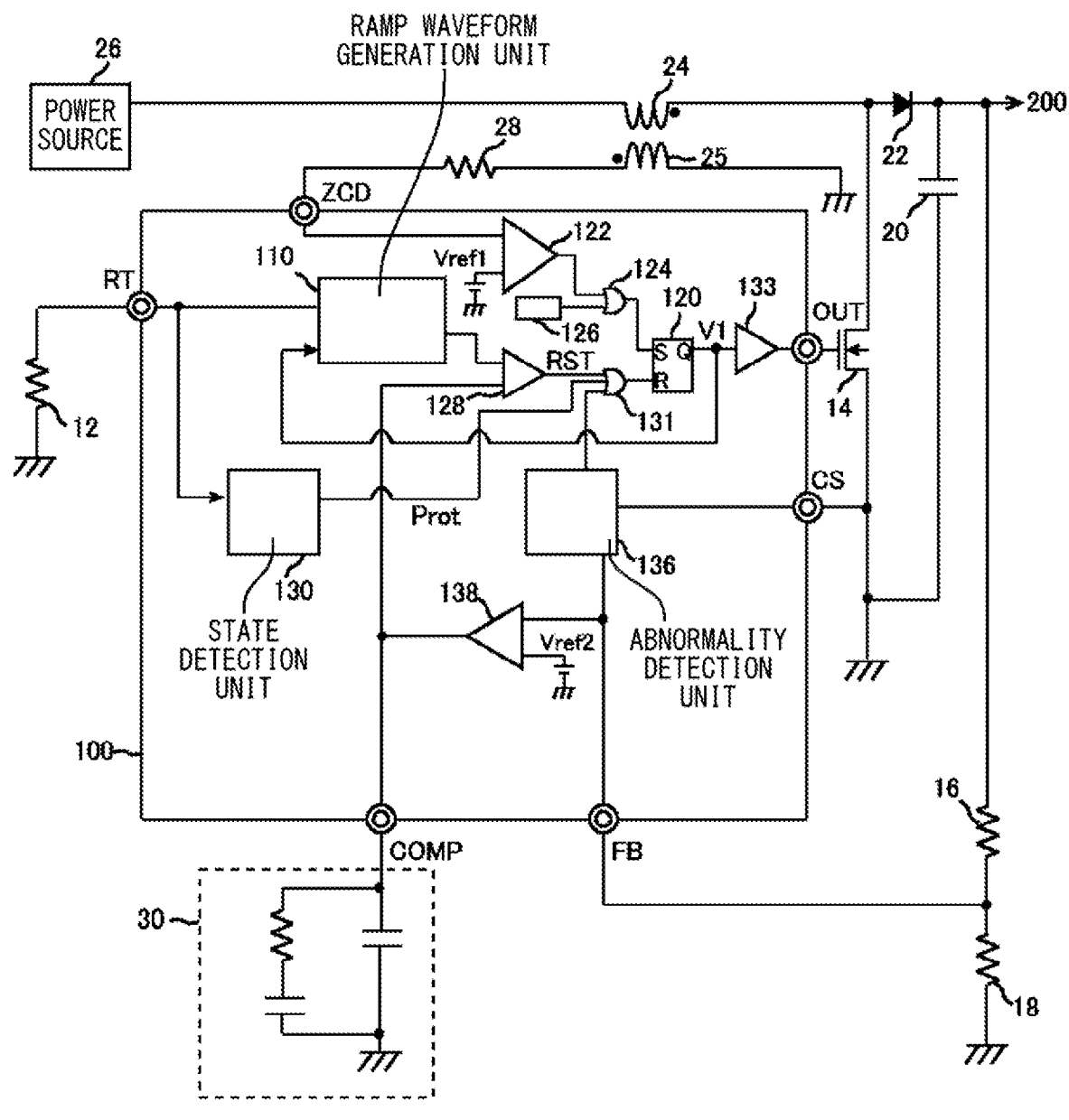
FIG. 5 illustrates another exemplary configuration of the power source circuit 10.

FIG. 5 illustrates another exemplary configuration of the power source circuit 10. The power source circuit 10 of this example is a circuit with an improved power factor of the output power. In this example, the configurations with the same signs as those in FIG. 1 to FIG. 4 may have the same functions and configurations as the examples of FIG. 1 to FIG. 4. The power source circuit 10 of this example has an inductor 25 and a resistance 28 in addition with respect to the examples shown in FIG. 1 to FIG. 4. The inductor 25 constitutes the transformer together with the inductor 24. A current corresponding to the current of the inductor 24 flows through the inductor 25. The resistance 28 connects the inductor 25 to the control circuit 100. The control circuit 100 has a ZCD terminal connected with the resistance 28. A current flowing through the inductor 25 and a voltage corresponding to the resistance value of the resistance 28 are applied to the ZCD terminal.

The control circuit 100 of this example has a comparator 122, an OR circuit 124 and a timer 126, in addition to the configurations described in FIG. 1 to FIG. 4. The comparator 122 compares the voltage of the ZCD terminal with the reference voltage Vref 1, and outputs the logical value corresponding to the comparison result. The comparator 122 of this example outputs the logical value 1 when the current flowing through the inductor 24 becomes zero. The timer 126 outputs a pulse indicating the logical value 1 in the predetermined period. The OR circuit 124 outputs the logical OR of the outputs of the comparator 122 and the timer 126.

The output control unit 120 controls the output transistor 14 to be at ON state when the logical value 1 is input by the OR circuit 124. The output control unit 120 of this example is a set reset flip-flop, to the set terminal of which the output signal of the OR circuit 124 is input. A driver 133 controls the output transistor 14 to be at ON state when the output control unit 120 outputs the logical value 1, and controls the output transistor 14 to be at OFF state when the output control unit 120 outputs the logical value 0.

The control circuit 100 of this example further includes an error amplifier 138, an abnormality detection unit 136, a comparator 128 and an OR circuit 131. The error amplifier 138 outputs the error voltage corresponding to the difference between the feedback voltage FB and the predetermined reference voltage Vref 2. The control circuit 100 may have a COMP terminal connected with a filter 30 for removing high frequency components of the output of the error amplifier 138.

The comparator 128 compares the ramp waveform Vramp output by the ramp waveform generation unit 110 with the error voltage output by the error amplifier 138, and outputs a reset signal RST of the duty ratio corresponding to the comparison result. The reset signal RST is the same as the example shown in FIG. 2.

The OR circuit 131 inputs the logical OR of the reset signal RST and the protection signal Prot output by the state detection unit 130, to the reset terminal of the output control unit 120. That is, when at least one of the reset signal RST and the protection signal Prot is the logical value 1, the output of the output control unit 120 becomes the logical value 0, and the output transistor 14 is turned to OFF state.

In this example, the timing of zero-crossing of the current flowing through the inductor 24 is detected, and the output transistor 14 is turned to ON state at the timing by the comparator 122. This enables the power factor correction control by reducing the phase difference between the current and the voltage by the so-called criticality control method, thus enabling low-loss and low-noise operations.

The abnormality detection unit 136 detects at least one abnormal state of overvoltage, undervoltage of the feedback voltage and overcurrent flowing through the output transistor 14. The control circuit 100 may have a CS terminal to which the potential between the output transistor 14 and the reference potential is input. The current flowing through the output transistor 14 can be detected from the potential. The abnormality detection unit 136 inputs the logical value 1 to the OR circuit 131 when any abnormal state is detected. This resets the output of the output control unit 120 and enables the output transistor 14 to be controlled to OFF state. This enables the protection of the power source circuit 10. Also, by providing the state detection unit 130, the power source circuit 10 can also be protected according to the state of the ramp resistance 12.

Figure 6:
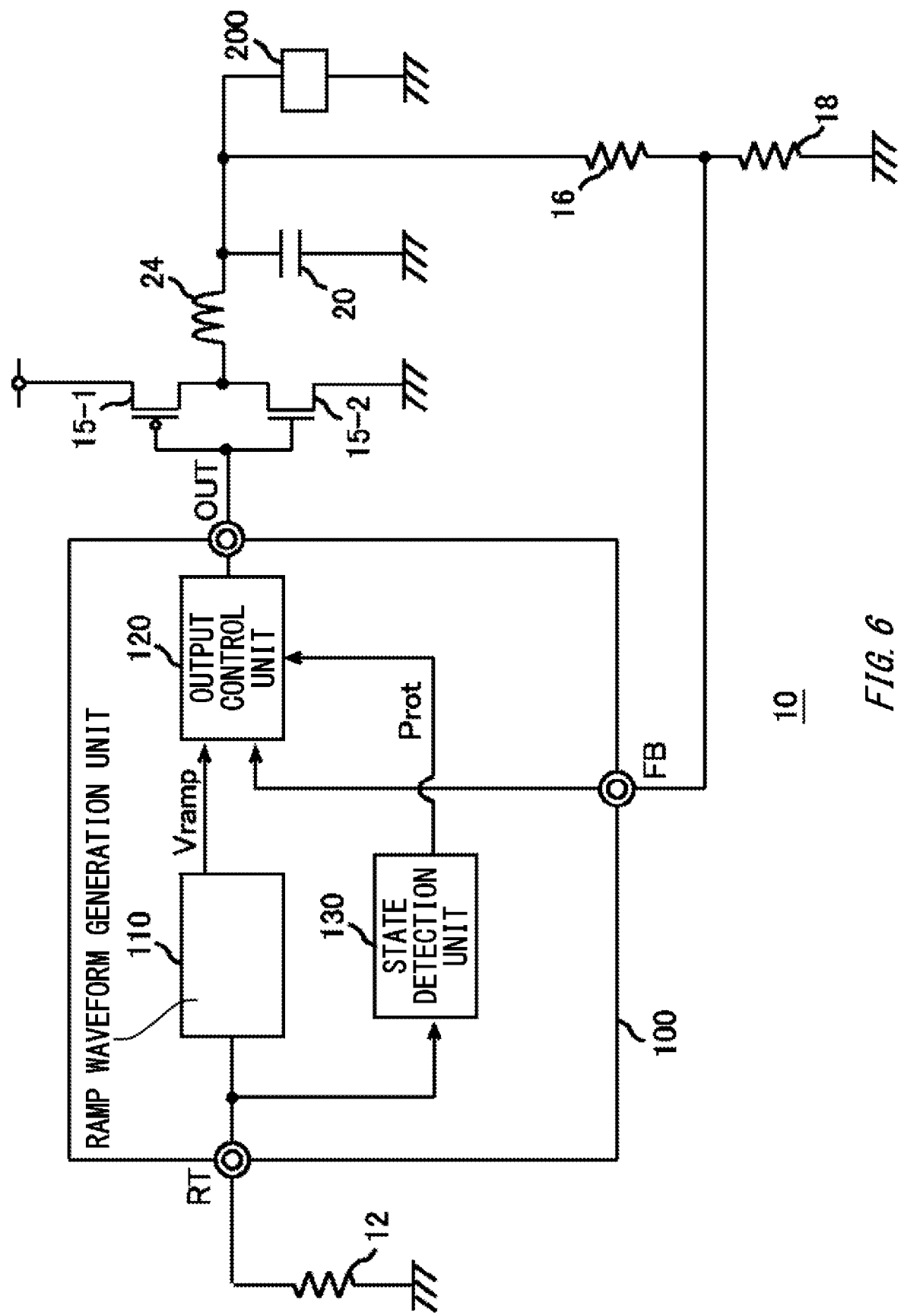
FIG. 6 illustrates another exemplary configuration of the power source circuit 10.

FIG. 6 illustrates another exemplary configuration of the power source circuit 10. The power source circuit 10 of this example includes a ramp resistance 12, a control circuit 100, an output transistor 15, an inductor 24, a capacitor 20, a voltage dividing resistance 16 and a voltage dividing resistance 18. The ramp resistance 12 and the control circuit 100 are the same as the examples of FIG. 1 to FIG. 4.

The output transistor 15 of this example functions as an inverter or a driver. The power source circuit 10 has an output transistor 15-1 and an output transistor 15-2 that operate complementary to each other. The output transistor 15-1 and the output transistor 15-2 of this example are a PMOS transistor and a NMOS transistor arranged in series between the high potential and the reference potential. The control circuit 100 controls the output transistor 15-1 and the output transistor 15-2.

The inductor 24 is connected to an output end of the inverter or driver. The output end refers to the connection point of the output transistor 15-1 and the output transistor 15-2. The capacitor 20 is provided between the connection point of the inductor 24 and the load 200, and the reference potential. The voltage dividing resistance 16 and the voltage dividing resistance 18 are provided in series between the connection point and the reference potential. The voltage at the connection point of the voltage dividing resistance 16 and the voltage dividing resistance 18 is applied to the feedback terminal FB of the control circuit 100.

The control circuit 100 controls the output transistor 15-1 and the output transistor 15-2, based on the comparison result between the ramp waveform generated corresponding to the ramp resistance 12 and the feedback voltage FB. In this example, the power source circuit 10 can be protected based on the state of the ramp resistance 12. As described in FIG. 1 to FIG. 6, the control circuit 100 of this example can be applied to various power source circuits for controlling the output transistor based on the ramp waveform.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: power source circuit; 12: ramp resistance; 14, 15: output transistor; 16: voltage dividing resistance; 18: voltage dividing resistance; 20: capacitor; 22: diode; 24, 25: inductor; 26: power source; 28: resistance; 30: filter; 100: control circuit; 110: ramp waveform generation unit; 120: output control unit; 122: comparator; 124: OR circuit; 126: timer; 128: comparator; 130: state detection unit; 131: OR circuit; 132: ramp current generation unit; 133: driver; 134: clamp power source; 136: abnormality detection unit; 138: error amplifier; 140: mirror current generation unit; 142, 144, 146, 148: transistor; 145: selection unit; 150: comparison unit; 152: current subtracting unit; 154, 156, 160, 162, 164, 166, 170, 172, 174, 176: transistor; 158, 168: current source; 171, 173, 175, 177: wiring; 180: voltage comparison unit; 182, 184: voltage comparison circuit; 190: inverter; 192: OR circuit; 200: load

What is claimed is:

1. A control circuit for controlling an output transistor for outputting power, comprising:
    a ramp terminal connected to a ramp resistance;
    a ramp waveform generation unit for generating a ramp waveform including a slope corresponding to a resistance value of the ramp resistance;
    an output control unit for controlling at least one of an ON time or an OFF time of the output transistor based on a comparison result between the ramp waveform and a comparison voltage; and
    a state detection unit for detecting a state of the ramp resistance connected to the ramp terminal,
    wherein the output control unit turns the output transistor to an OFF state based on an output of the state detection unit regardless of the comparison result, when the state of the ramp resistance becomes a predetermined state,
    wherein the state detection unit detects a ramp current flowing through the ramp terminal,
    wherein the state detection unit has:
        a mirror current generation unit for generating a mirror current of the ramp current; and
        a comparison unit for comparing the mirror current with at least one of an upper allowable limit value and a lower allowable limit value of the mirror current,
    wherein the comparison unit has:
        a current subtracting unit for generating a differential current obtained by subtracting a reference current corresponding to the upper allowable limit value or the lower allowable limit value from the mirror current; and
        a voltage comparison unit for comparing a differential voltage corresponding to the differential current with a reference voltage, and
    wherein a current value of the reference current in the current subtracting unit is variable.

2. The control circuit according to claim 1, wherein the output control unit turns the output transistor to an OFF state when the resistance value of the ramp resistance becomes out of an allowable range.

3. The control circuit according to claim 1, comprising a clamp power source for clamping a voltage applied to the ramp terminal.

4. The control circuit according to claim 1, wherein a ratio of a current value of the mirror current to a current value of the ramp current in the mirror current generation unit is variable.

5. The control circuit according to claim 1, wherein, when the current value of the reference current in the current subtracting unit is changed, the mirror current generation unit changes a ratio of a current value of the mirror current to a current value of the ramp current, corresponding to the change.

6. The control circuit according to claim 1, wherein the state detection unit detects a voltage applied to the ramp terminal.

7. A power source circuit, comprising:
    an output transistor for outputting power; and
    a control circuit according to claim 1 for controlling the output transistor.

8. A control circuit for controlling an output transistor for outputting power, comprising:
    a ramp terminal connected to a ramp resistance;
    a ramp waveform generation unit for generating a ramp waveform including a slope corresponding to a resistance value of the ramp resistance;
    an output control unit for controlling at least one of an ON time or an OFF time of the output transistor based on a comparison result between the ramp waveform and a comparison voltage; and
    a state detection unit for detecting a state of the ramp resistance connected to the ramp terminal,
    wherein the output control unit turns the output transistor to an OFF state based on an output of the state detection unit regardless of the comparison result, when the state of the ramp resistance becomes a predetermined state,
    wherein the state detection unit detects a ramp current flowing through the ramp terminal;
    wherein the state detection unit has:
        a mirror current generation unit for generating a mirror current of the ramp current, the mirror current including a first mirror current and a second mirror current; and
        a comparison unit for comparing the first mirror current with a lower allowable limit value of the mirror current and comparing the second mirror current with an upper allowable limit value of the mirror current.

9. The control circuit according to claim 8, wherein the comparison unit has:
    a first current subtracting unit for generating a first differential current obtained by subtracting a first reference current corresponding to the lower allowable limit value from the first mirror current;
    a first voltage comparison unit for comparing a first differential voltage corresponding to the first differential current with a first reference voltage;
    a second current subtracting unit for generating a second differential current obtained by subtracting a second reference current corresponding to the upper allowable limit value from the second mirror current; and
    a second voltage comparison unit for comparing a second differential voltage corresponding to the second differential current with a second reference voltage.

* * * * *